(12) United States Patent
Luo et al.

(10) Patent No.: US 11,898,074 B2
(45) Date of Patent: Feb. 13, 2024

(54) BLUE THERMALLY ACTIVATED DELAYED FLUORESCENCE MATERIAL, SYNTHESIS METHOD THEREOF, AND USE THEREOF

(71) Applicant: WUHAN CHINA STAR OPTOELECTRONICS SEMICONDUCTOR DISPLAY TECHNOLOGY CO., LTD., Hubei (CN)

(72) Inventors: Jiajia Luo, Hubei (CN); Jinchang Huang, Hubei (CN); Lin Yang, Hubei (CN); Qu Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 672 days.

(21) Appl. No.: 16/973,824

(22) PCT Filed: Sep. 10, 2019

(86) PCT No.: PCT/CN2019/105069
§ 371 (c)(1),
(2) Date: Dec. 10, 2020

(87) PCT Pub. No.: WO2020/237901
PCT Pub. Date: Dec. 3, 2020

(65) Prior Publication Data
US 2021/0253947 A1    Aug. 19, 2021

(30) Foreign Application Priority Data

May 31, 2019   (CN) .......................... 201910473160.0

(51) Int. Cl.
*C09K 11/06*   (2006.01)
*H10K 85/40*   (2023.01)
(Continued)

(52) U.S. Cl.
CPC .............. *C09K 11/06* (2013.01); *H10K 85/40* (2023.02); *H10K 85/6572* (2023.02);
(Continued)

(58) Field of Classification Search
CPC .................................................. H10K 2101/20
See application file for complete search history.

(56) References Cited

FOREIGN PATENT DOCUMENTS

| CN | 106279148 A | * | 1/2017 |
| CN | 106397318 A | | 2/2017 |
| KR | 20170057729 A | | 5/2017 |

* cited by examiner

*Primary Examiner* — Sean M DeGuire
(74) *Attorney, Agent, or Firm* — SOROKER AGMON NORDMAN RIBA

(57) ABSTRACT

The present disclosure relates to the field of organic light-emitting materials, and more particularly, to a blue thermally activated delayed fluorescence material, a synthesis method thereof, and use thereof. The blue thermally activated delayed fluorescence material has a following structural formula:

(Continued)

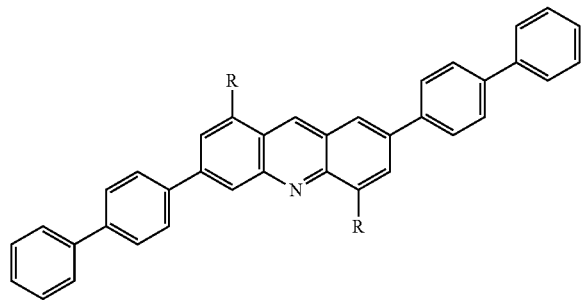

the present disclosure provides a novel blue thermally activated delayed fluorescence material which has a lower singlet triplet energy level difference, a high RISC rate constant (kRISC), and a high photoluminescence quantum yield (PLQY) by finely adjusting a structure of electron acceptor units, making them have different abilities to accept electrons, thereby realizing fine adjustment of spectrum in the deep blue range.

9 Claims, 1 Drawing Sheet

(51) Int. Cl.
  *H10K 85/60* (2023.01)
  *H10K 50/16* (2023.01)
  *H10K 50/17* (2023.01)
(52) U.S. Cl.
  CPC .............. *C09K 2211/104* (2013.01); *C09K 2211/1014* (2013.01); *C09K 2211/1033* (2013.01); *H10K 50/16* (2023.02); *H10K 50/17* (2023.02)

BLUE THERMALLY ACTIVATED DELAYED FLUORESCENCE MATERIAL, SYNTHESIS METHOD THEREOF, AND USE THEREOF

FIELD OF INVENTION

The present disclosure relates to the field of organic light-emitting materials, and more particularly, to a blue thermally activated delayed fluorescence material, a synthesis method thereof, and use thereof.

BACKGROUND OF INVENTION

Organic light-emitting diodes (OLEDs) are sandwich type devices constituted by a structure of electrode/light-emitting layer/electrode, which was invented by American-Chinese professor Deng Qingyun et al. When current passes, a strong electric field will drive the organic light-emitting layer between the electrodes of a device to emit light. Based on electroluminescence phenomenon of OLEDs, OLEDs are widely used in fields of information display and solid-state lighting.

Technical Problems

Continuous updating of organic light-emitting materials has greatly promoted development of OLED technology. In general, fluorescent materials are the first generation, and transition metal complex phosphorescent materials are the second generation. The fluorescent materials as the first generation have longer service lives, but have low luminous efficiency; ratio of excitons in singlet and triplet states is 1:3, and theoretical upper limit of internal quantum efficiency is only 25% in OLEDs, thereby greatly limiting applications of fluorescent electroluminescent devices. Singlet state of the transition metal complex phosphorescent materials as the second generation can be transferred to triplet state by intersystem crossing (ISC), and internal quantum efficiency thereof is close to 100%. However, phosphorescent materials need to be doped with noble rare metals such as Ir and Pt, which have higher material costs and shorter service lives. Furthermore, problems, such as unstable performances of phosphorescent blue light materials, remain to be solved.

Thermally activated delayed fluorescence (TADF) materials are new type organic light-emitting materials, which have low cost and high efficiency, and are called the third generation organic light-emitting materials. Through ingenious molecular designs, the molecule has a lower minimum singlet triplet energy level difference (LEST), which can convert triplet excitons into singlet exciton radiation to emit light by thermal excitation reverse intersystem crossing, thereby breaking through the theoretical limit of 25% utilization rate of traditional fluorescent materials and achieving 100% luminescence quantum efficiency. Due to involvement of excitons in the process of reverse intersystem crossing from triplet state to singlet state, TADF materials usually exhibit photochemical long-lived fluorescence (delayed fluorescence). Lifetime of delayed fluorescence can be on order of microseconds to milliseconds, significantly different from traditional fluorescent materials. TADF materials combine advantages of good stability of organic fluorescent materials and high luminous efficiency of transition metal complex phosphorescent materials, have wide applications, and are one of current research hotspots. For thermally activated delayed fluorescence materials, a high RISC rate constant (kRISC) and a high photoluminescence quantum yield (PLQY) are necessary conditions for preparing high efficiency OLEDs. For now, thermally activated delayed fluorescence materials having a high kRISC and a high PLQY at the same time and suitable for blue organic electroluminescence devices are still lacking. In addition, due to a broad spectrum of thermally activated delayed fluorescence materials, and exciton lifetime on order of microseconds, its use in mass production device structures is greatly limited.

SUMMARY OF INVENTION

An objective of the present disclosure is to provide a blue thermally activated delayed fluorescence material with high luminous efficiency and long service life.

To achieve the above objective, the present disclosure provides following technical solutions:

A blue thermally activated delayed fluorescence material, having a following structural formula:

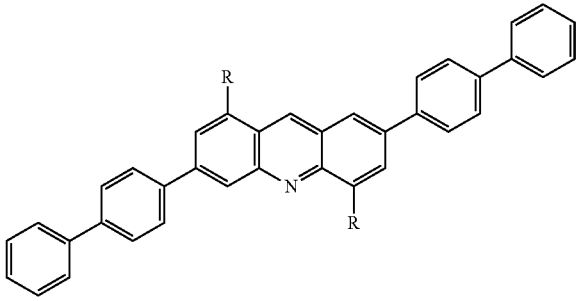

wherein, R is selected from one of following structural formulas:

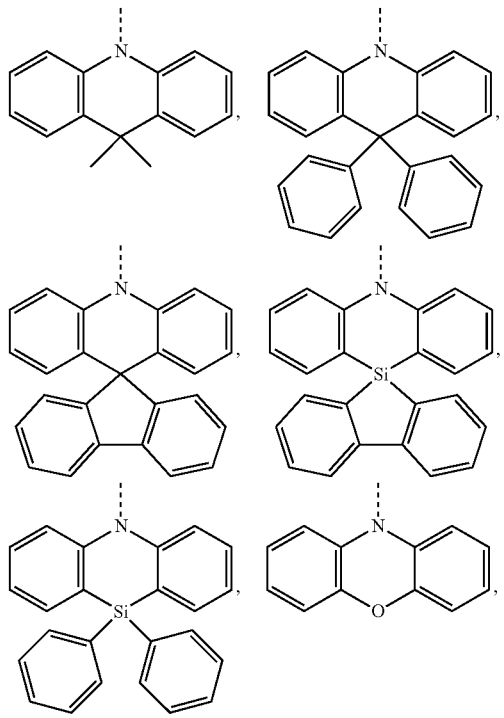

-continued

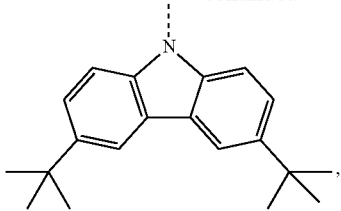

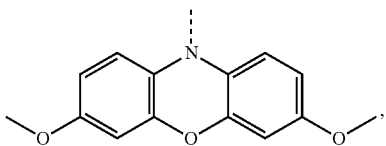

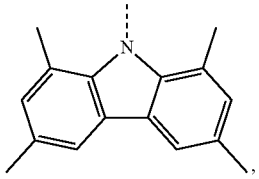

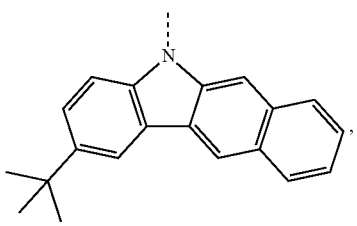

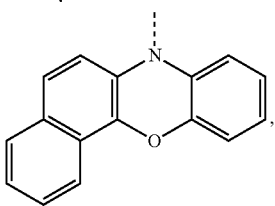

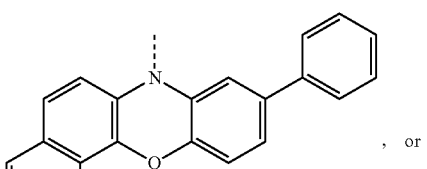, or

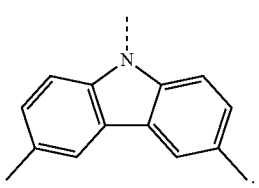.

Another objective of the present disclosure is to provide a synthesis method of the above blue thermally activated delayed fluorescence material. The method comprises following steps: under an inert gas environment, a Buchwald-Hartwig coupling reaction between a raw material 1 and a raw material 2 performed under an effect of a palladium catalyst to obtain the blue thermally activated delayed fluorescence material;

wherein, the raw material 1 has the following structural formula:

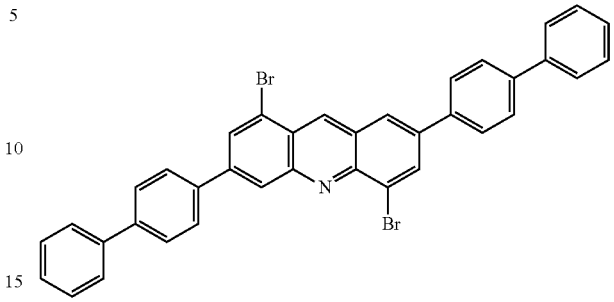

the raw material 2 is selected from one of 9,9-diphenyl-9,10-dihydroacridine, phenoxazine, 3,6-dimethyl-9H-carbazole, 10H-spiro[acridine-9,9'-fluorene], 9,9-dimethyl-9,10-dihydroacridine, 9,10-dihydro-9,9-diphenylsila acridine, 3,7-dimethoxy-10H-phenoxazine, 10H-silaspiro[acridine-9,9'-fluorene], 7H-benzo[C]phenoxazine, 9-phenyl-7H-benzo[C]phenoxazine, 3, 6-di-tert-butyl-9H-carbazole, 1,3,6,8-tetramethyl-9H-carbazole, or 2-(tert-butyl)-5H-benzo[b] carbazole; and a molar ratio of the raw material 1 to the raw material 2 ranges from 1:2 to 1:6, and preferably is 1:2.4.

Preferably, a reaction temperature of the Buchwald-Hartwig coupling reaction ranges from 80° C. to 160° C., and a reaction time thereof ranges from 12 hours to 48 hours; preferably the reaction temperature is 120° C., and the reaction time is 24 hours.

Preferably, a reaction solvent of the Buchwald-Hartwig coupling reaction is dehydrated and deoxygenated toluene; the palladium catalyst is selected from one of palladium acetate, palladium nitrate, palladium chloride, or palladium sulfate.

Preferably, after finishing the Buchwald-Hartwig coupling reaction, a reaction product is subjected to cooling, extraction, column chromatography separation, and purification in sequence to obtain the blue thermally activated delayed fluorescence material.

Another objective of the present disclosure is to provide a use of the above blue thermally activated delayed fluorescence material or a use of the blue thermally activated delayed fluorescence material prepared by the above synthesis method in organic electroluminescence. The use comprises but not limited to use in electrothermally activated delayed fluorescent device.

Specifically, the electrothermally activated delayed fluorescent device comprises a substrate layer, a light-emitting layer, and a cathode layer in a stack, and a light-emitting material for the light-emitting layer is the above blue thermally activated delayed fluorescence material or the blue thermally activated delayed fluorescence material prepared by the above synthesis method.

Preferably, the electrothermally activated delayed fluorescent device further comprises a hole injection layer disposed on the substrate layer, a transport layer disposed on the hole injection layer, and an electron transport layer disposed between the light-emitting layer and the cathode layer.

The present disclosure further provides a light-emitting device which comprises the above electrothermally activated delayed fluorescent device.

Beneficial effect: the present disclosure provides a novel blue thermally activated delayed fluorescence material which has a lower single triplet energy level difference, a high RISC rate constant (kRISC), and a high photoluminescence quantum yield (PLQY) by finely adjusting a structure of electron acceptor units, making them have different abilities to accept electrons, thereby realizing fine adjustment of spectrum in the deep blue range.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
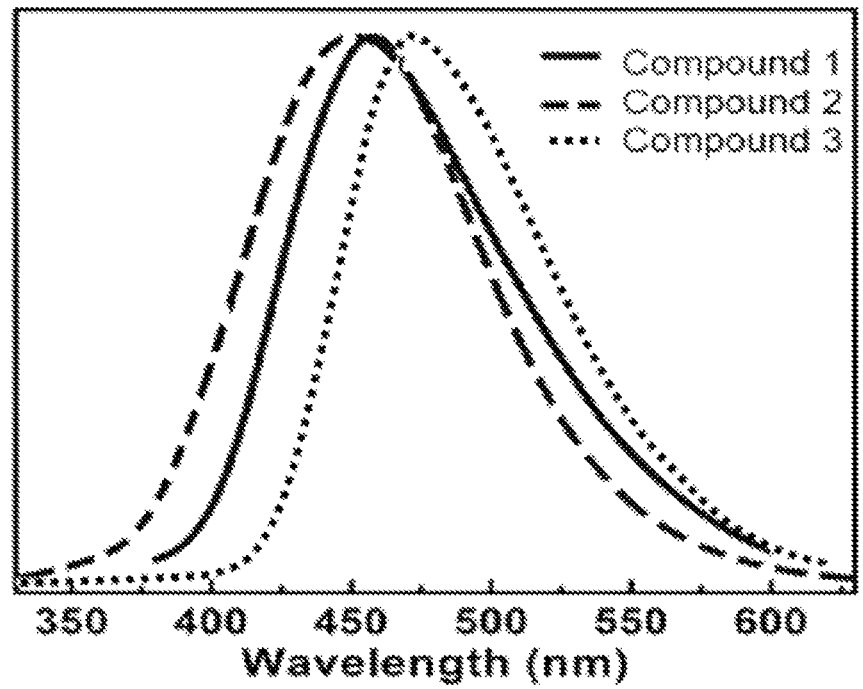
FIG. 1 is photoluminescence spectrums of compound 1 to compound 3 in a toluene solution at room temperature obtained according to embodiment 1 to embodiment 3 of the present disclosure.

The present disclosure will be further described below in conjunction with embodiments 1 to 3 and application embodiments 1 to 3.

Embodiment 1: Synthesis of a Blue Thermally Activated Delayed Fluorescence Material The reaction formula is as follows:

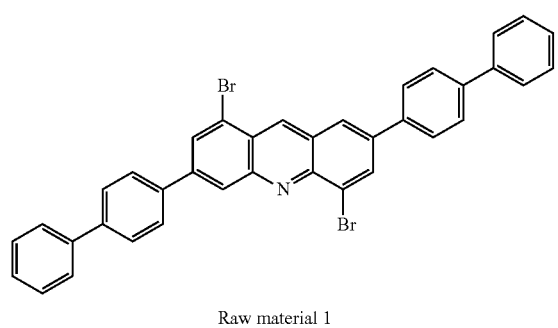

Raw material 1

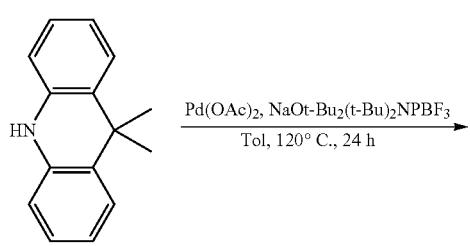

-continued

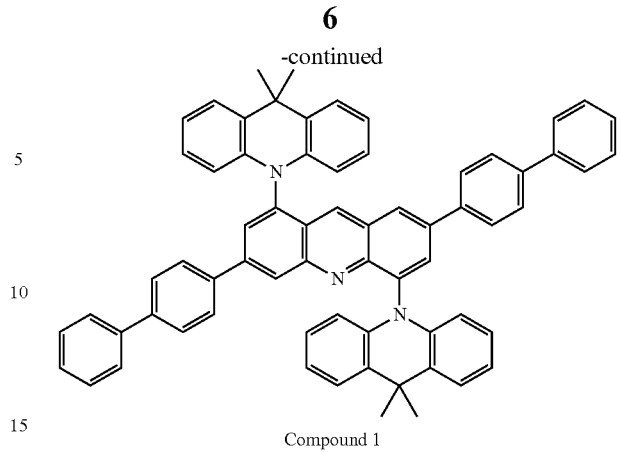

Compound 1

Weigh 3.19 g of raw material 1 (5 mmol), 4.00 g of 9,9-diphenyl-9, 10-dihydroacridine (12 mmol), 0.18 g of palladium acetate (0.8 mmol) and 0.68 g of tri-tert-butylphosphine tetrafluoroborate (2.4 mmol) respectively, and pour into a 250 mL two-necked flask. Transfer the two-necked flask which contains the reaction raw material to a glove box, then add 2.34 g of NaOt-Bu (24 mmol) to the two-necked flask in the glove box, then inject 100 mL of toluene which is dehydrated and deoxygenated under an argon atmosphere, and then react at 120° C. for 24 hours. Cool to room temperature, the reaction solution is poured into 200 mL of ice water, and is extracted three times with dichloromethane. Combine the organic phase to spin to a silica gel column chromatography (volume of dichloromethane:volume of n-hexane, 1:3) to separate and purify to obtain 2.3 g of light blue powders. The yield is 51%.

The nuclear magnetic resonance spectrum of the obtained product (compound 1) is: 1H NMR (300 MHz, CD2Cl2, δ): 8.18 (s, 1H), 7.91 (s, 1H), 7.75-7.63 (m, 4H), 7.51-7.40 (m, 14H), 7.30-7.18 (m, 17H), 6.95-6.89 (m, 2H), 1.69 (s, 12H).

Embodiment 2: Synthesis of a Blue Thermally Activated Delayed Fluorescence Material The reaction formula is as follows:

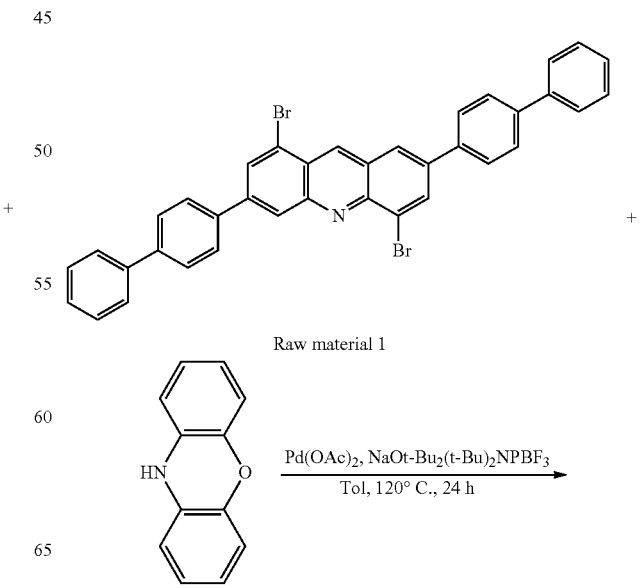

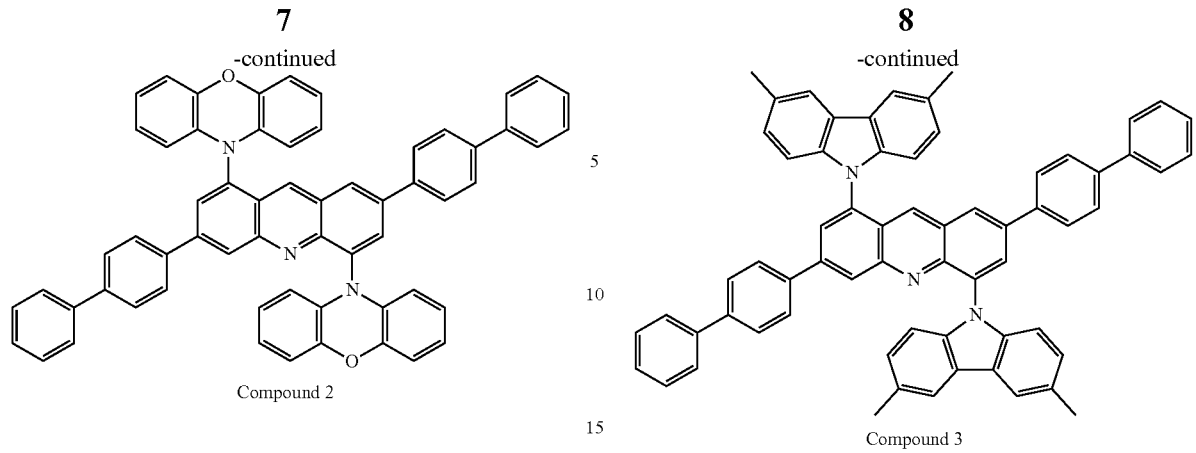

Compound 2

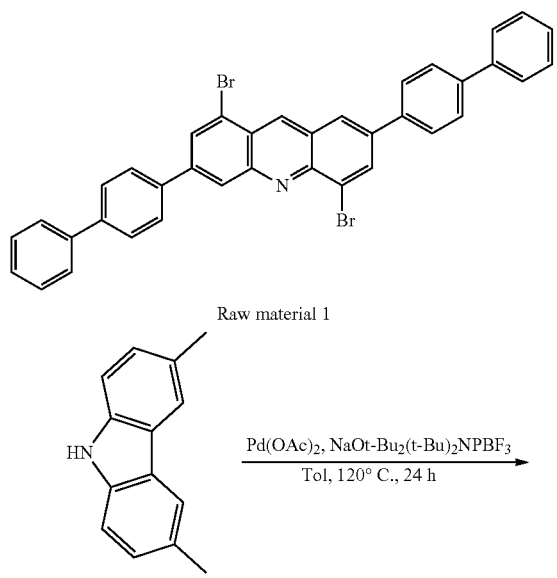

Compound 3

Weigh 3.19 g of raw material 1 (5 mmol), 2.20 g of phenoxazine (12 mmol), 0.18 g of palladium acetate (0.8 mmol) and 0.68 g of tri-tert-butylphosphine tetrafluoroborate (2.4 mmol) respectively, and pour into a 250 mL two-necked flask. Transfer the two-necked flask which contains the reaction raw material to a glove box, then add 2.34 g of NaOt-Bu (24 mmol) to the two-necked flask in the glove box, then inject 100 mL of toluene which is dehydrated and deoxygenated under an argon atmosphere, and then react at 120° C. for 24 hours. Cool to room temperature, the reaction solution is poured into 200 mL of ice water, and is extracted three times with dichloromethane. Combine the organic phase to spin to a silica gel column chromatography (volume of dichloromethane:volume of n-hexane, 1:3) to separate and purify to obtain 2.1 g of light blue powders. The yield is 49%.

The nuclear magnetic resonance spectrum of the obtained product (compound 2) is: 1H NMR (300 MHz, CD2Cl2, δ): 8.18 (s, 1H), 7.91 (s, 1H), 7.75-7.63 (m, 4H), 7.51-7.40 (m, 14H), 7.30-7.18 (m, 13H), 6.93-6.89 (m, 6H).

Embodiment 3: Synthesis of a Blue Thermally Activated Delayed Fluorescence Material The reaction formula is as follows:

Weigh 3.19 g of raw material 1 (5 mmol), 2.34 g of 3,6-Dimethyl-9H-carbazole (12 mmol), 0.18 g of palladium acetate (0.8 mmol) and 0.68 g of tri-tert-butylphosphine tetrafluoroborate (2.4 mmol) respectively, and pour into a 250 mL two-necked flask. Transfer the two-necked flask which contains the reaction raw material to a glove box, then add 2.34 g of NaOt-Bu (24 mmol) to the two-necked flask in the glove box, then inject 100 mL of toluene which is dehydrated and deoxygenated under an argon atmosphere, and then react at 120° C. for 24 hours. Cool to room temperature, the reaction solution is poured into 200 mL of ice water, and is extracted three times with dichloromethane. Combine the organic phase to spin to a silica gel column chromatography (volume of dichloromethane:volume of n-hexane, 1:3) to separate and purify to obtain 2.6 g of light blue powders. The yield is 60%.

The nuclear magnetic resonance spectrum of the obtained product (compound 3) is: 1H NMR (300 MHz, CD2Cl2, δ): 8.80 (s, 4H), 8.18 (s, 1H), 7.89 (d, J=6.3 Hz, 1H), 7.75-7.63 (m, 4H), 7.51-7.46 (m, 4H), 7.36-7.21 (m, 10H), 7.17-7.10 (m, 4H), 6.98 (d, J=6.6 Hz, 4H), 2.46 (s, 12H). (Using a nuclear magnetic resonance frequency of 300 MHz, the solvent is deuterated dichloromethane, and cooling by liquid nitrogen.)

Electrochemical energy levels and other parameters of compounds 1 to 3 obtained according to embodiments 1 to 3 are tested, the results are as shown in the following table 1:

TABLE 1 the lowest singlet state (S1), the lowest triplet state (T1), and electrochemical energy levels of compound 1 to compound 3.

| | PL Peak (nm) | $S_1$ (eV) | $T_1$ (eV) | $E_{ST}$ (eV) | HOMO (eV) | LUMO (eV) |
|---|---|---|---|---|---|---|
| Compound 1 | 458 | 2.71 | 2.61 | 0.10 | −5.46 | −2.43 |
| Compound 2 | 473 | 2.62 | 2.53 | 0.09 | −5.56 | −2.43 |
| Compound 3 | 451 | 2.75 | 2.70 | 0.05 | −5.41 | −2.43 |

Results of photoluminescence spectrums of compound 1 to compound 3 in a toluene solution at room temperature obtained according to embodiment 1 to embodiment 3 are as shown in FIG. 1. In FIG. 1, waveforms from left to right are respectively photoluminescence spectrums of compound 2, compound 1, and compound 3. It can be known from FIG. 1: emission spectrums of compounds 1 to 3 all fall within the blue light range, particularly compound 1 and compound 3, which are deep blue light having an emission peak of less than 460 nm.

Application Embodiment 1: An Electrothermally Activated Delayed Fluorescent Device 1

An electrothermally activated delayed fluorescent device can be prepared according to methods known in the art, such as a method disclosed in the reference of Adv. Mater. 2003, 15, 277. The specific method is: vapor depositing MoO3, TCTA, DPEPO+a blue thermally activated delayed fluorescence material, TmPyPB, 1 nm of LiF, and 100 nm of Al on a cleaned conductive glass substrate (ITO) under a high vacuum condition in sequence.

Figure 2:
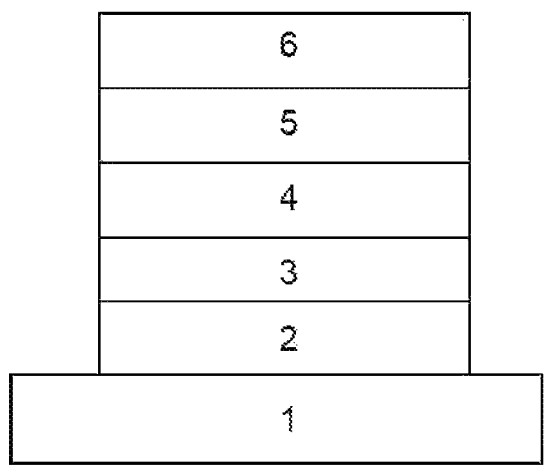
FIG. 2 is a schematic structural diagram of an electrothermally activated delayed fluorescent device according to an application embodiment of the present disclosure.

A structure of the electrothermally activated delayed fluorescent device is as shown in FIG. 2, which comprises: a substrate layer 1, a hole injection layer 2 disposed on the substrate layer 1, a transport layer 3 disposed on the hole injection layer 2, a light-emitting layer 4 disposed on the transport layer 3, an electron transport layer 5 disposed on the light-emitting layer 4, and a cathode layer 6 disposed on the electron transport layer 5. The substrate layer 1 is a glass or a conductive glass (ITO), the hole injection layer 2 is made of MoO3, the transport layer 3 is made of Tris(4-carbazoyl-9-ylphenyl)amine (TCTA), the light-emitting layer 4 is made of the compound 1 obtained according to embodiment 1, the transport layer 5 is made of 1,3,5-tris(3-(3-pyridyl)phenyl)benzene (TmPyPB), and the cathode layer 6 is made of lithium fluoride/aluminum. The structure of formed device 1 is: ITO/MoO3 (2 nm)/TCTA (35 nm)/DPEPO:compound 1 (3%, 20 nm)/TmPyPB (40 nm)/LiF (1 nm)/Al (100 nm).

Application Embodiment 2: An Electrothermally Activated Delayed Fluorescent Device 2

Application embodiment 2 uses the same method as application embodiment 1. The difference is that the light-emitting layer 4 is made of the compound 2 obtained according to embodiment 2. A structure of formed device 2 is: ITO/MoO3 (2 nm)/TCTA (35 nm)/DPEPO: compound 2 (3%, 20 nm)/TmPyPB (40 nm)/LiF (1 nm)/Al (100 nm).

Application Embodiment 3: An Electrothermally Activated Delayed Fluorescent Device 3

Application embodiment 3 uses the same method as application embodiment 1. The difference is that the light-emitting layer 4 is made of the compound 3 obtained according to embodiment 3. A structure of formed device 3 is: ITO/MoO3 (2 nm)/TCTA (35 nm)/DPEPO: compound 3 (3%, 20 nm)/TmPyPB (40 nm)/LiF (1 nm)/Al (100 nm).

Performances of the devices 1 to 3 obtained according to application embodiments 1 to 3 are tested. Current-brightness-voltage characteristics of the device are measured by Keithley source measurement system with a calibrated silicon photodiode (Keithley 2400 Sourcemeter, Keithley 2000 Currentmeter). Electroluminescence spectrums are measured by SPEX CCD3000 spectrometer (from JY company, French) at room temperature under atmospheric environment. The test results are as shown in table 2.

TABLE 2 tested performances of devices.

| Device | Maximum current efficiency (cd/A) | CIEy | Maximum external quantum efficiency (%) |
|---|---|---|---|
| Device 1 | 33.1 | 0.15 | 21.3% |
| Device 2 | 32.3 | 0.21 | 21.7% |
| Device 3 | 29.3 | 0.13 | 18.4% |

Industrial applicability: The subject matter of the present disclosure can be manufactured and used in the industry, thereby having industrial applicability.

What is claimed is:

1. A blue thermally activated delayed fluorescence material, having a following structural formula:

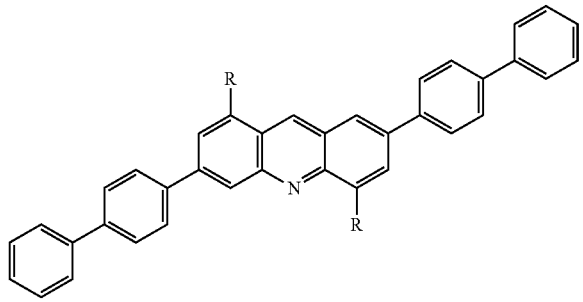

wherein, R is selected from one of following structural formulas:

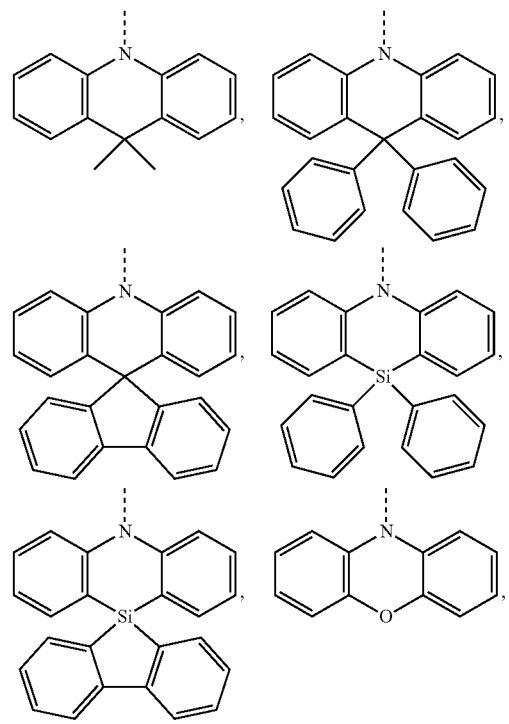

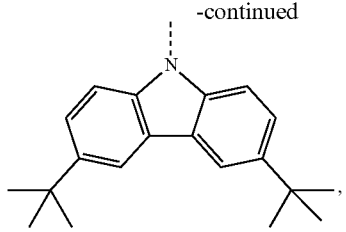

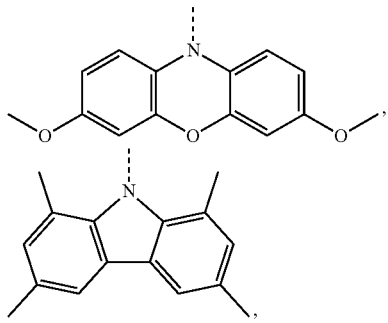

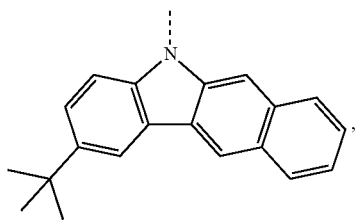

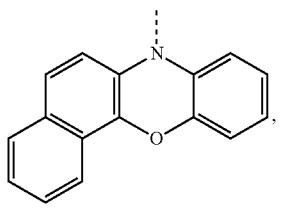

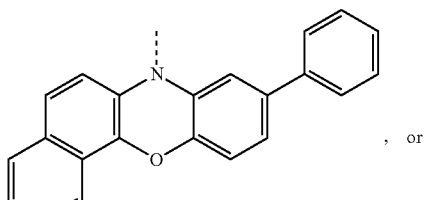

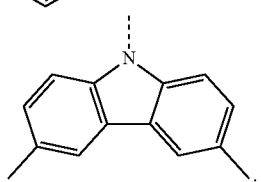

2. A synthesis method of a blue thermally activated delayed fluorescence material, comprising following steps: under an inert gas environment, performing a Buchwald-Hartwig coupling reaction between a raw material 1 and a raw material 2 under an effect of a palladium catalyst to obtain the blue thermally activated delayed fluorescence material;

wherein, the raw material 1 has a following structural formula:

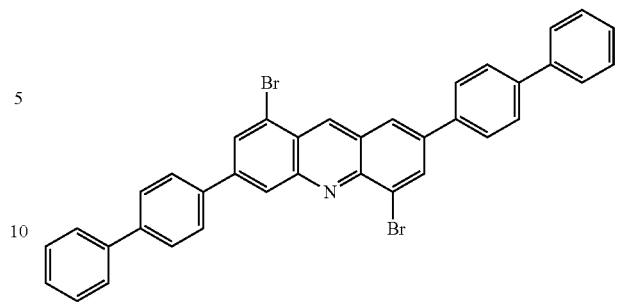

the raw material 2 is selected from one of 9,9-diphenyl-9,10-dihydroacridine, phenoxazine, 3,6-dimethyl-9H-carbazole, 10H-spiro[acridine-9,9'-fluorene], 9,9-dimethyl-9,10-dihydroacridine, 9,10-dihydro-9,9-diphenylsila acridine, 3,7-dimethoxy-10H-phenoxazine, 10H-silaspiro[acridine-9,9'-fluorene], 7H-benzo[C]phenoxazine, 9-phenyl-7H-benzo[C]phenoxazine, 3, 6-di-tert-butyl-9H-carbazole, 1,3,6,8-tetramethyl-9H-carbazole, or 2-(tert-butyl)-5H-benzo[b]carbazole; and a molar ratio of the raw material 1 to the raw material 2 ranges from 1:2 to 1:6.

3. The synthesis method of the blue thermally activated delayed fluorescence material according to claim 2, wherein a reaction temperature of the Buchwald-Hartwig coupling reaction ranges from 80° C. to 160° C., and a reaction time thereof ranges from 12 hours to 48 hours.

4. The synthesis method of the blue thermally activated delayed fluorescence material according to claim 2, wherein a reaction solvent of the Buchwald-Hartwig coupling reaction is dehydrated and deoxygenated toluene; the palladium catalyst is selected from one of palladium acetate, palladium nitrate, palladium chloride, or palladium sulfate.

5. The synthesis method of the blue thermally activated delayed fluorescence material according to claim 2, wherein, after finishing the Buchwald-Hartwig coupling reaction, a reaction product is subjected to cooling, extraction, column chromatography separation, and purification in sequence to obtain the blue thermally activated delayed fluorescence material.

6. An organic electroluminescent device comprising a blue thermally activated delayed fluorescence material;

wherein the blue thermally activated delayed fluorescence material has the following structural formula:

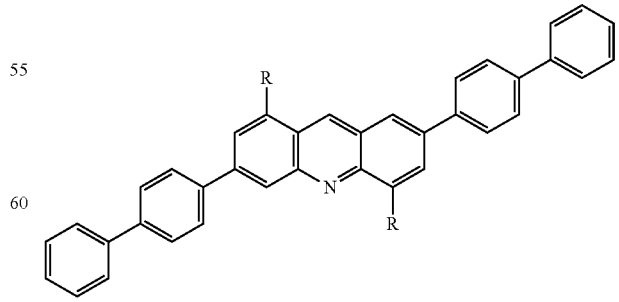

wherein, R is selected from one of the following structural formulas:

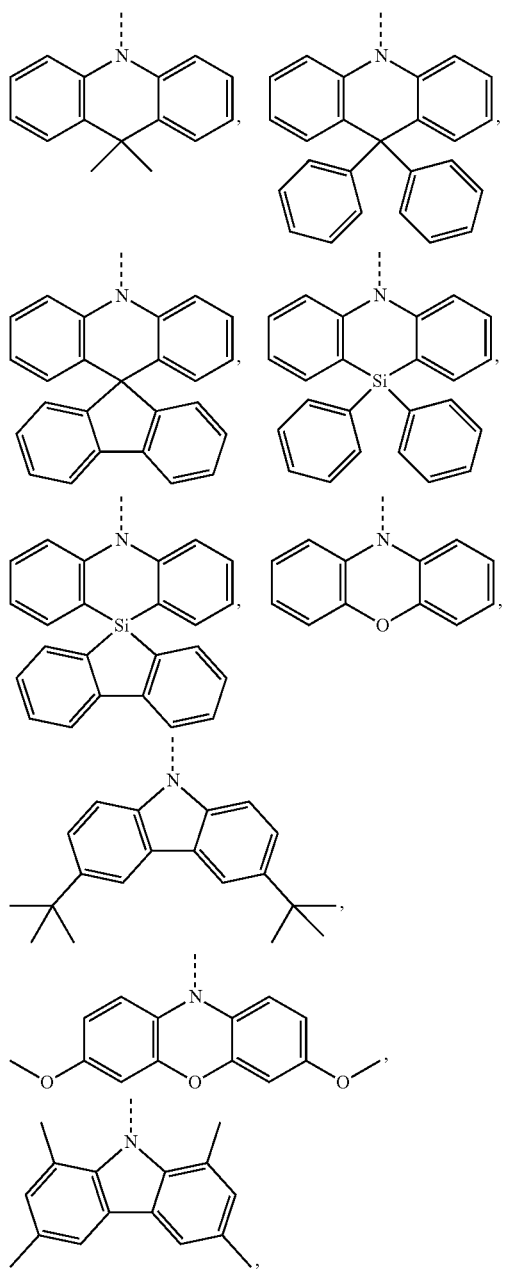

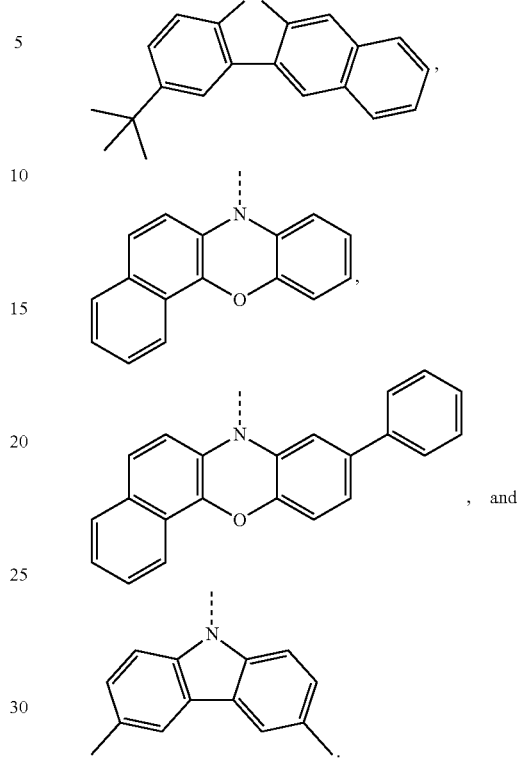

7. The organic electroluminescent device according to claim 6, wherein the organic electroluminescent device is an electrothermally activated delayed fluorescent device.

8. The organic electroluminescent device according to claim 7, wherein the electrothermally activated delayed fluorescent device comprises a substrate layer, a light-emitting layer, and a cathode layer in a stack, and a light-emitting material of the light-emitting layer is the blue thermally activated delayed fluorescence material.

9. The organic electroluminescent device according to claim 8, wherein the electrothermally activated delayed fluorescent device further comprises a hole injection layer disposed on the substrate layer, a transport layer disposed on the hole injection layer, and an electron transport layer disposed between the light-emitting layer and the cathode layer.

* * * * *